United States Patent [19]

Inoue et al.

[11] Patent Number: 4,888,732
[45] Date of Patent: Dec. 19, 1989

[54] DYNAMIC RANDOM ACCESS MEMORY HAVING OPEN BIT LINE ARCHITECTURE

[75] Inventors: Michihiro Inoue, Ikoma; Toshio Yamada, Sakai, both of Japan

[73] Assignee: Matsushita Electric Industrial Co., Ltd., Osaka, Japan

[21] Appl. No.: 157,263

[22] Filed: Feb. 18, 1988

[30] Foreign Application Priority Data

Feb. 23, 1987 [JP] Japan .................................. 62-39419
Oct. 2, 1987 [JP] Japan .................................. 62-250129

[51] Int. Cl.[4] ............................................. G11C 13/00
[52] U.S. Cl. .................................. 365/51; 365/230.01
[58] Field of Search ........................... 365/189, 230, 51

[56] References Cited

U.S. PATENT DOCUMENTS 3,402,398  9/1968  Keerner et al. ...................... 365/189
4,025,907  5/1977  Karp et al. ........................... 365/189

Primary Examiner—Terrell W. Feras
Attorney, Agent, or Firm—Wenderoth, Lind & Ponack

[57] ABSTRACT

A dynamic random access memory which includes a sense amplifier, first pair of bit lines extending in the opposite directions from the sense amplifier, second pair of bit lines extending in the opposite directions from the sense amplifier and disposed in parallel with the first pair of bit lines, a plurality of word lines disposed in a manner that the word lines perpendicularly intersect with the first and second pairs of bit lines, and a plurality of memory cells disposed at all intersecting points of the word lines and the first and second pairs of bit lines. Two bit lines selected from the first and second pairs of bit lines are coupled to the sense amplifier. Since two bit lines or two groups of memory cells can be disposed at one side of the sense amplifier, space efficiency can be highly improved without damaging the operating characteristics of a dynamic random access memory.

2 Claims, 5 Drawing Sheets

DYNAMIC RANDOM ACCESS MEMORY HAVING OPEN BIT LINE ARCHITECTURE

BACKGROUND OF THE INVENTION

The present invention relates to a dynamic random access memory having open bit line architecture, and more particularly to a dynamic random access memory with open bit line architecture in which pitch of memory cells becomes nothing to do with pitch of sense amplifiers.

Generally, open bit line type dynamic random access memory (open type DRAM) is of the structure that two groups of bit lines are extended in the opposite directions from sense amplifiers disposed at the center of two groups of bit lines.

Since memory cells can be disposed at all intersecting points of word lines and bit lines in open-type DRAM, it is advantageous to have high density packaging. In other words, more memory cells can be positioned in a predetermined area on a semiconductor chip, compared with other type DRAM, i.e., folded bit line type DRAM in which two groups of bit lines are extended in the same direction from sense amplifiers.

Although open type DRAM has the above-stated advantage, it has the following disadvantage. As apparent from FIG. 1, an open type DRAM, generally, has sense amplifiers 101, 102 ..., two groups of bit lines 201, 202 ..., and 301, 302 ... which are extended in the opposite direction from said sense amplifiers 101, 102 ..., and memory cells 401, 402 ... which are disposed at all intersecting points 501, 502 ... of said bit lines 201, 202 ..., 301, 302 and word lines 601, 602 ... In such an open type DRAM, the number of memory cells counted along one of word lines 601, 602, ... must be the same as the number of sense amplifiers 101, 102 ... In other words, pitch of adjacent sense amplifiers has some close relation to pitch of adjacent memory cells disposed along word line.

Generally, several transistors (e.g., six transistors) are necessitated to form a sense amplifier, whereas a memory cell is formed by one transistor and one capacitor. Therefore, if size of memory cells is extremely reduced to obtain high density thereby producing DRAM with large capacity, the pitch of adjacent memory cells disposed along a word line becomes considerably smaller than the pitch of sense amplifiers. However, since the pitch of adjacent memory cells has close relation to the pitch of sense amplifiers, size of entire DRAM can not be reduced so much, although the pitch of memory cells can be considerably minimized.

SUMMARY OF THE INVENTION

The present invention, therefore, has as its principal object the provision of an improved DRAM with open bit line architecture in which the pitch of memory cells has substantially nothing to do with the pitch of sense amplifiers to obtain high density packaging.

This and other objects are accomplished by an open-type DRAM which includes a sense amplifier, first pair of bit lines extending in the opposite directions from said sense amplifier, second pair of bit lines extending in the opposite directions from said sense amplifier and disposed in parallel with the first pair of bit lines, two bit lines selected from the first and second pairs of bit lines being coupled to the sense amplifier in a manner that the selected two bit lines extend in the opposite directions from the sense amplifier, a plurality of word lines disposed in a manner that the word lines perpendicularly intersect with the first and second pairs of bit lines, and a plurality of memory cells disposed at all intersecting points of the word lines and the first and second pairs of bit lines.

According to the present invention as described herein, the following benefits, among others, are obtained:

An improved open-type DRAM in which memory cells can be disposed at all cross sections of bit lines and word lines can be realized.

While the novel features of the invention are set forth with particularly in the appended claims, the invention both as to organization and content, will be better understood and appreciated, along with other objects and features thereof, from the following detailed description taken in conjunction with the drawings.

DETAILED DESCRIPTION OF THE INVENTION

Figure 1:
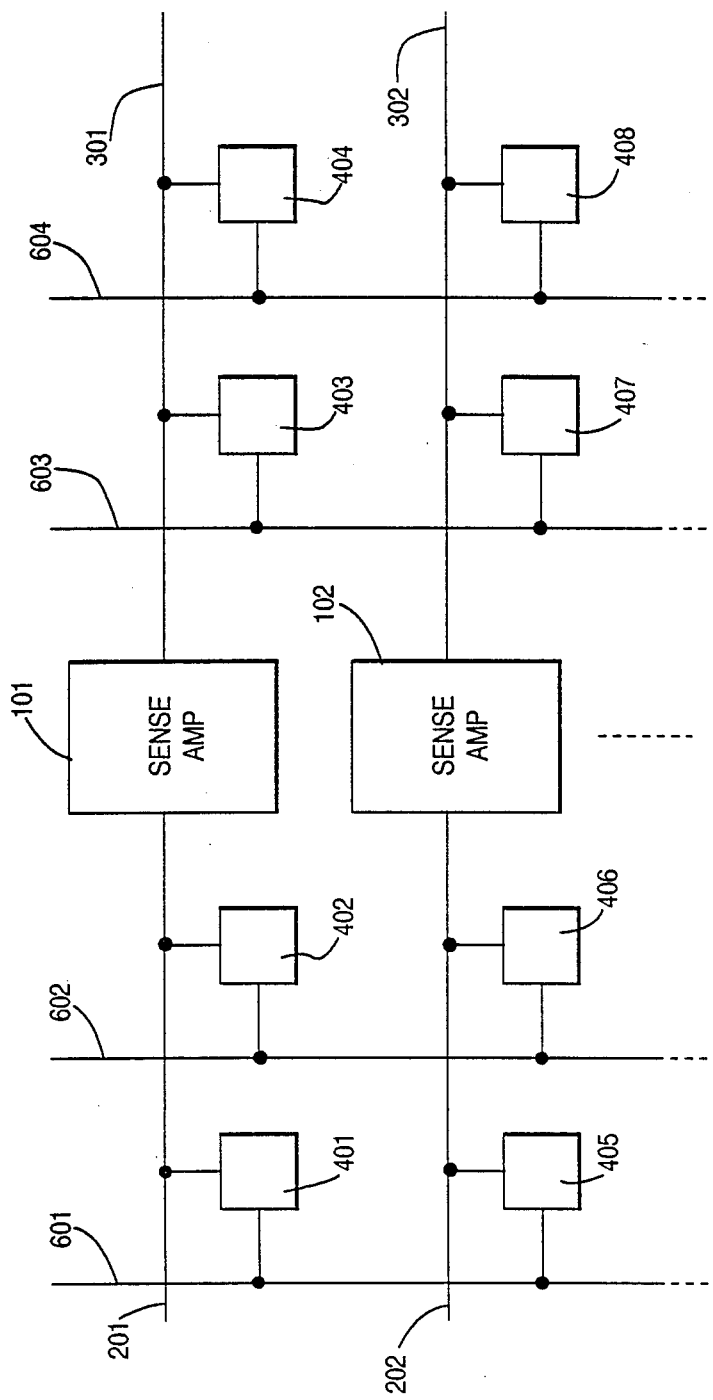
FIG. 1 is a schematic circuit diagram of a conventional open-type DRAM.
Figure 2:
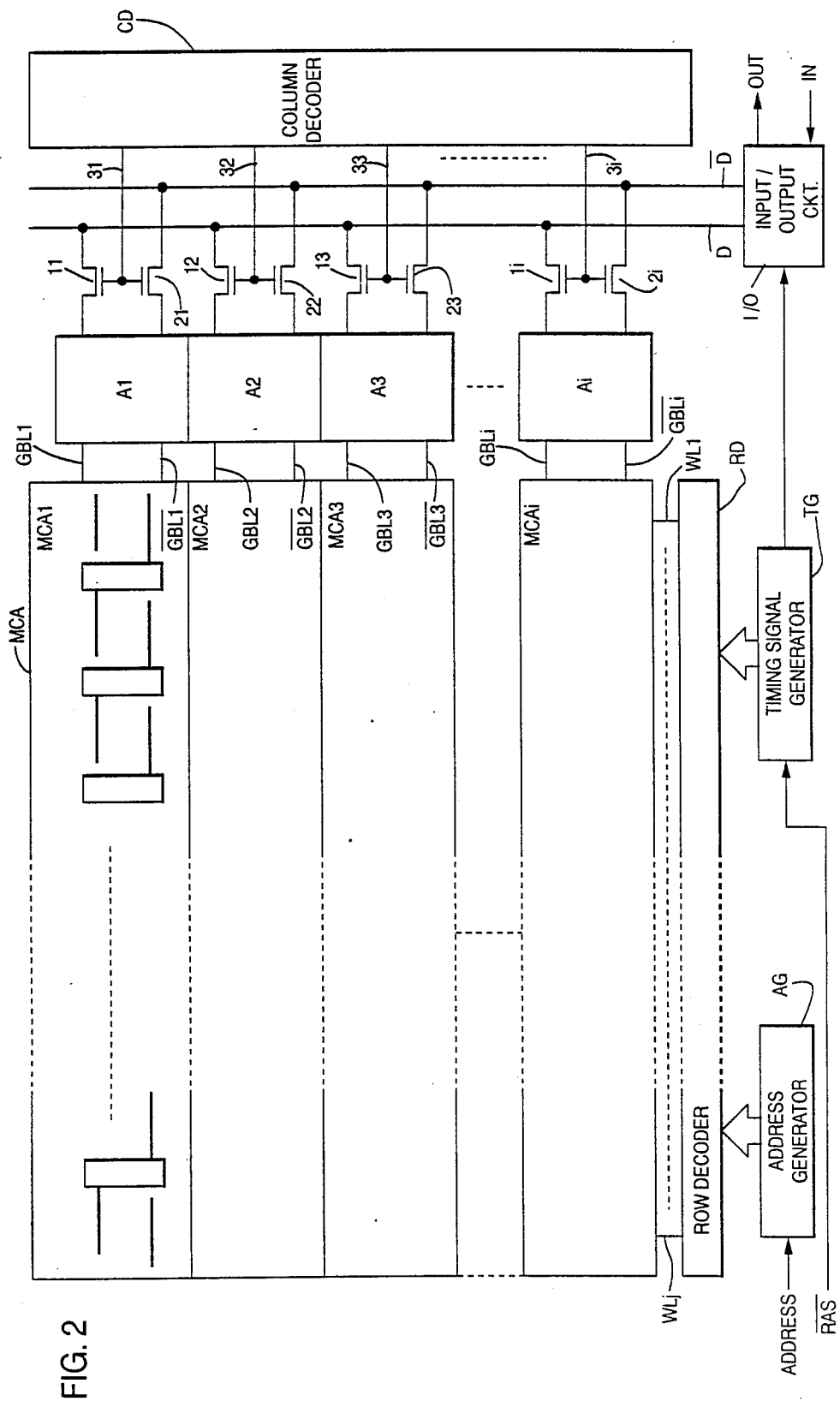
FIG. 2 is a schematic circuit diagram of an open-type DRAM as one embodiment of the invention.

FIG. 2 shows a DRAM with open bit line architecture as one embodiment of the invention in both electrical and topographical manners. Memory cell array MCA comprises a plurality of memory cell sub-arrays MCA1, MCA2, ..., MCAi (i; integer). Each sub-array MCAi includes a pair of global bit lines GBLi, $\overline{GBLi}$ (i; integer, i.e., GBL1, $\overline{GBL1}$, GBL2, $\overline{GBL2}$, ...) which are disposed in parallel manner as shown in FIG. 2. A plurality of word lines WL1, ..., WLj (j; integer) which are disposed in parallel manner and also in a manner that they intersect with global bit lines GBLi (i; integer) perpendicularly. Amplifiers A1, A2, ..., Ai (i; integer) are disposed at one end of memory cell sub-arrays MCA1, ..., MCAi and each pair of global bit lines are connected to each amplifier. For example, a pair of bit lines BL1, $\overline{BL1}$ are connected to amplifier A1. Further, amplifiers A1, A2, ..., Ai are connected to complementary data buses D, $\overline{D}$ through pairs of data access transistors 11, 21; 12, 22; ...; 1i, 2i. Therefore, global bit lines are coupled to a pair of data buses D, $\overline{D}$ through amplifiers and data access field effect transistors. The data buses are coupled to input/output circuit I/O to receive input data IN and to produce output data OUT.

The pairs of data access transistors are controlled by column decoder CD. More specifically, gate electrodes of first pairs of transistors 11, 21 are coupled to column decoder CD through conductor 31. In the same manner, gate electrodes of i-th pairs of transistors 1i, 2i are coupled to column decoder CD through conductor 3i.

Each sense amplifier is coupled to global bit line GBLi through switching transistor 41, 42, ..., 4k and to global bit line $\overline{GBLi}$ through switching transistor 51, 52, ..., 5k. Gate electrodes of each pair of transistors 41, 51, 42, 52, ... 4k, 5k are coupled to segment control circuits SC1, SC2, ..., SCk, respectively. The segment control circuits are controlled by address generator AG and timing signal generator TG.

A pair of bit lines BL1, $\overline{BL1}$, BL2, $\overline{BL2}$, ..., BLk, $\overline{BLk}$ are coupled to each sense amplifiers SA1, SA2, ..., SAk. That is, bit lines BLk, $\overline{BLk}$ are extended in the opposite direction from a sense amplifier. Non use bit lines BLD1, BLD2, which are not coupled to any sense amplifier, are disposed at both ends of memory cell sub-array. The memory cell subarray is shown in both electrical and topographical manners in FIG. 3. As apparent from FIG. 3, first group bit lines BLD1, $\overline{BL1}$, $\overline{BL2}$, ..., $\overline{BLk}$ are disposed in a line and second group bit lines, BL1, BL2, ..., BLk, BLD2 are disposed in a different line which is parallel to said line. These two kinds of bit lines disposed in parallel to each other are intersected by word lines WL, WL2, ..., WLj perpendicularly. At all intersecting points of bit lines and word lines, memory cells MC1, MC2, ... MCl (l; integer) are disposed. The structure of each memory cell is the same and shown in FIG. 4 as one example. Each memory cell MC comprises a MOS FET Tc whose source or drain is coupled to a bit line BL and whose drain or source is coupled to voltage, V plate through a memory cell capacitor C and whose gate is coupled to word line WL.

Word lines WL1, ..., WLj are coupled to row decoder RD. Row decoder RD is controlled by signals from address generator AG and timing signal generator TG. The address generator AG receives an address command which indicates an address that a user wishes to select. The timing signal generator TG receives $\overline{RAS}$, $\overline{CAS}$ signals, and also controls input/output circuit I/O.

Figure 3:
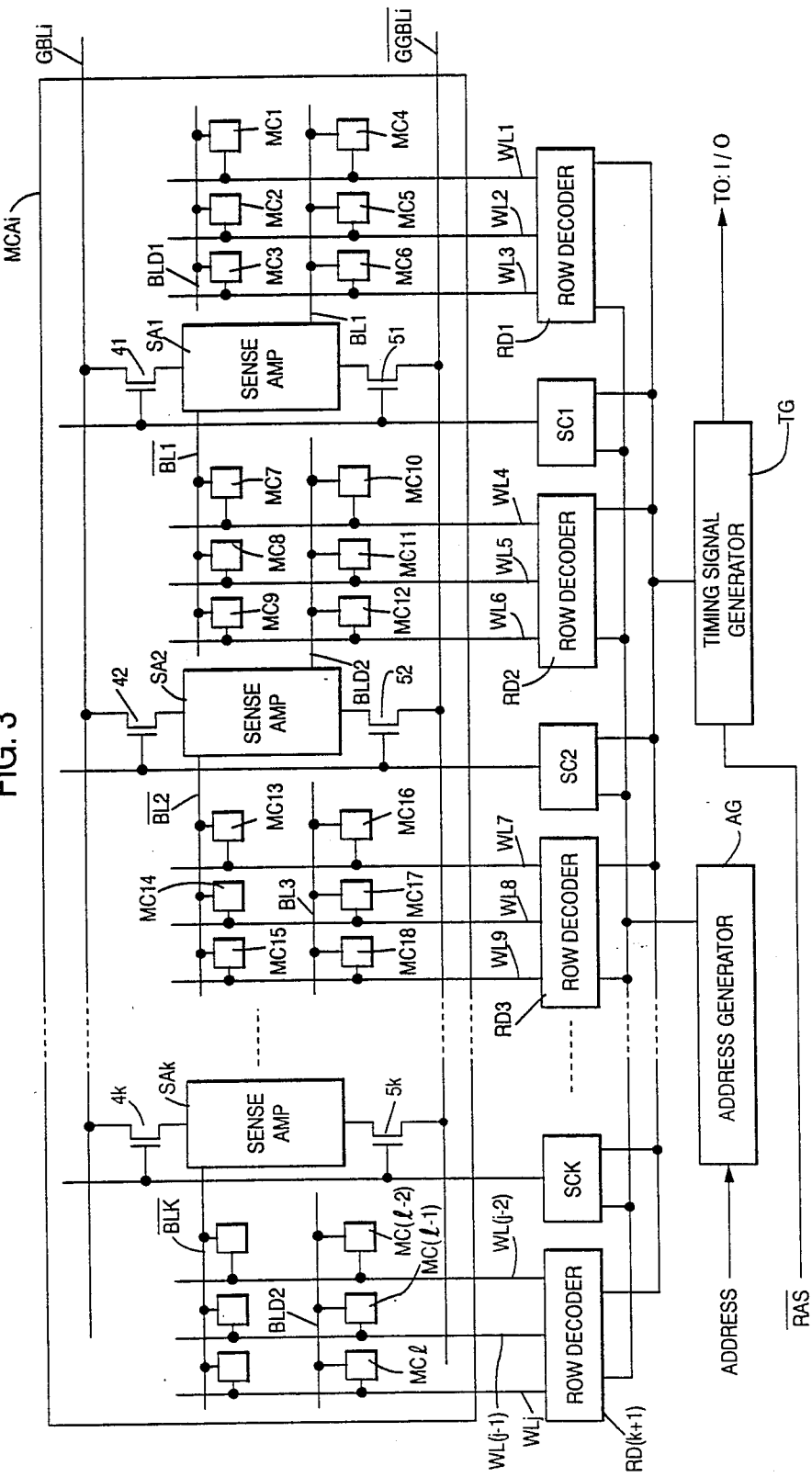
FIG. 3 is a schematic circuit diagram of the memory cells and sense amplifiers portion of the open-type DRAM shown in FIG. 2.
Figure 4:
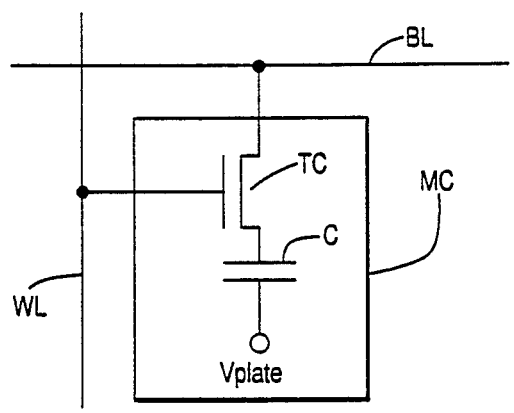
FIG. 4 is a circuit diagram of a memory cell shown in FIG. 3.
Figure 5:
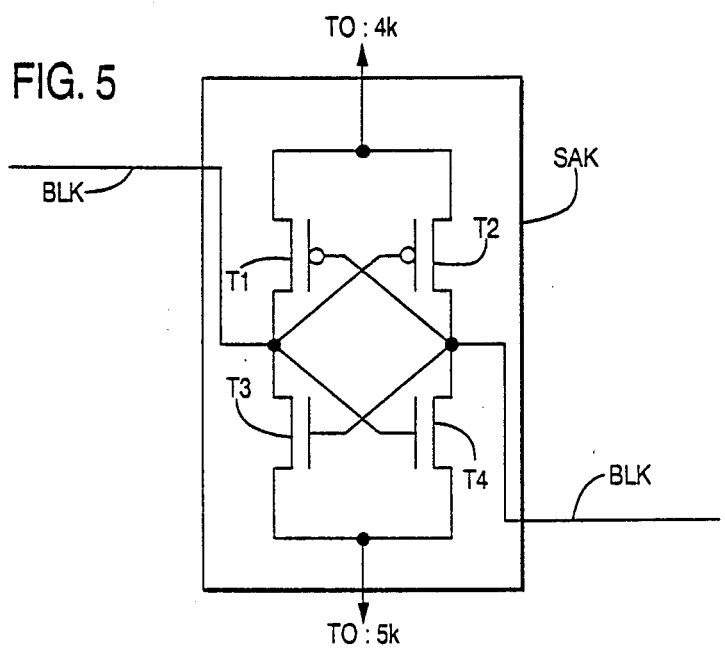
FIG. 5 is a circuit diagram of a sense amplifier shown in FIG. 3.

The structure of each memory sub-array is the same and shown in FIG. 3. Each memory cell sub-array MCAi includes a plurality of sense amplifiers SA1, SA2, ..., SAk (k; integer; in this embodiment, k=32). The structure of each sense amplifier is the same and shown in FIG. 5 as one example. The sense amplifier includes P-type MOS FETs T1, T2 and N-type MOS FETs T3, T4 which form flip-flop circuit for sense amplification.

As apparent from FIG. 3, a sense amplifier (e.g., SA1) and a pair of bit lines (e.g., BL1, $\overline{BL1}$; form an open bit line memory cell architecture. For example, if word line WL4 is activated by row decoder RD2, memory cells MC7 and MC10 become simultaneously in a situation of writing and reading. Therefore, one of sense amplifiers SA1 and SA2 is selected and activated by address signal, one of memory cells MC7 and MC10 operates.

As stated above, bit line, BLD1 and BLD2 are not coupled to any sense amplifier. Therefore, memory cells MC1, MC2, MC3, MC(l-2) MC(l-1), and MCl are not used for reading and writing operations. However, if these bit lines BLD1, BLD2 are removed, output load of row decoder RD1 or RD(k+1) becomes different from output load of other row decoder RD2, ..., or RDk and also, coupling capacitance of bit lines BL1 or $\overline{BLk}$ becomes different from that between bit lines $\overline{BL1}$ and BL2, $\overline{BL2}$ and BL3, ..., so that stable operating characteristic can not be attained. Therefore, the bit lines BLD1, BLD2 have important role to obtain stable operating characteristic.

The operation of the semiconductor memory device shown in FIGS. 2 and 3 is now explained.

When information stored in memory cell MC6 is readout, word line WL3 is first selected by row decoder unit RD1 and then, transistor in memory cell MC6 (see, FIG. 4) is rendered conductive. As a result, signal charge in capacitor C (see, FIG. 4) is readout to bit line BL1 and thereby, there occurs minute difference of electric potential between bit lines BL1 and $\overline{BL1}$. The minute difference is, then, amplified by sense amplifier SA1. The signal voltage amplified by sense amplifier SA1 is applied to a pair of global bit lines GBLi and $\overline{GBLi}$ through readout transistors 41, 51. Thereafter, the signal voltage is further amplified by amplifier Ai, and then, readout to complementary data buses D, $\overline{D}$ through MOS transistors 1i, 2i which are rendered conductive by column decoder CD.

When information stored in memory cell MC10 is readout, word line WL4 is selected and signal charge is readout to bit line BL2. Minute difference of electric potential between bit lines BL2 and $\overline{BL2}$ is amplified by sense amplifier SA2. The signal voltage amplified by sense amplifier SA2 is applied to amplifier Ai through readout transistors 42, 52, and global bit lines GBLi, $\overline{GBLi}$.

Data writing operation is carried out in the reverse sequences opposite to said-stated reading sequences.

Figure 6:
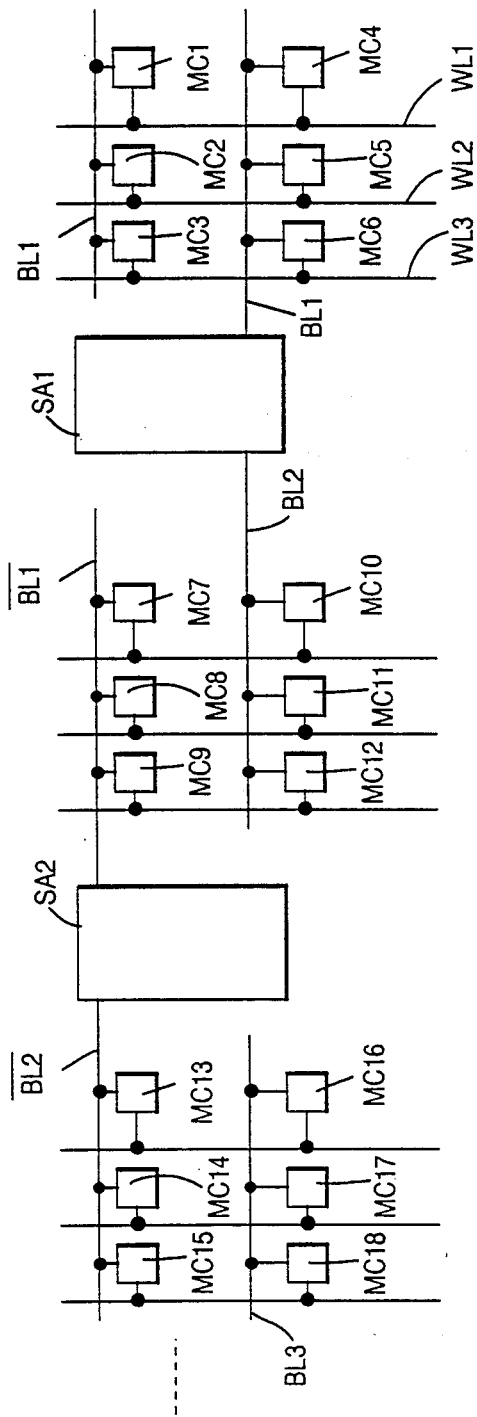

FIG. 6 shows another example of memory cell sub-array structure. As apparent from the comparison of FIGS. 3 and 6, bit line BL2 is coupled to sense amplifier SA1, and bit line $\overline{BL1}$ is coupled to sense amplifier SA2. In the same manner, coupling change is carried out. Others are the same as in FIG. 3.

In the above stated two examples, two bit lines BLD1, BLD2 are disposed as a dummy (not used for operation of writing and reading). In other words, cells MC1~MC3, MC(l-2)~MCl coupled to bit lines BLD1, BLD2 are not used for writing and reading operations. This structure is advantageous in a case that a lot of sense amplifiers are included in a memory sub-array, but dis-advantageous in a case that small number (one or two or something like that) of sense amplifiers are included in a sub-array.

Because, a lot of cells are coupled to bit lines BLD1, BLD2 and these many cells do not contribute to the operation of DRAM.

Figure 7:
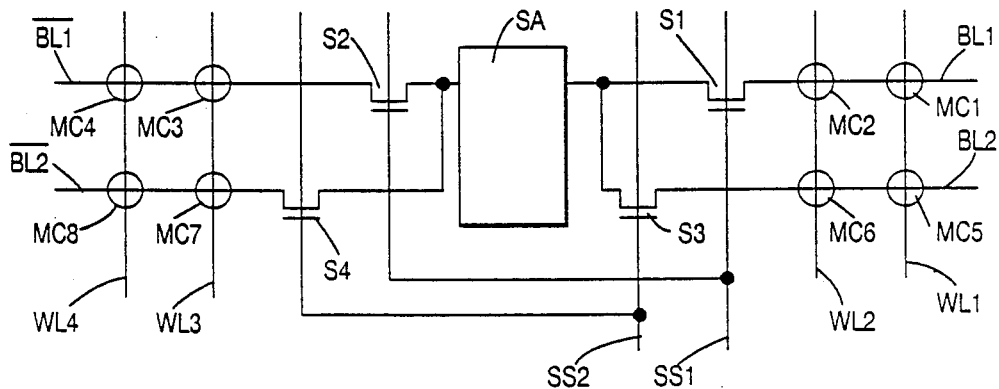
FIG. 6 and 7 are schematic circuit diagrams of second and third embodiments of the memory cells and sense amplifiers portion.

FIG. 7 shows another example which can solve the above-stated problem.

In FIG. 7, a sense amplifier SA is coupled to bit lines BL1, $\overline{BL1}$, and BL2, $\overline{BL2}$ through switching transistors S1~S4. Memory cells MC1~MC8 are disposed at all intersecting points of bit lines and word lines WL1~WL4. Switching transistors S1~S4 are controlled by signals SS1, SS2. FIG. 7 structure is an 8 bit memory. Signal SS1 selects a pair of bit lines BL1, $\overline{BL1}$, and signal SS2 selects a pair of bit lines BL2, $\overline{BL2}$.

For example, if SS1 is "1" and SS2 is "0", switching transistors S1 and S2 are rendered conductive and switching transistors S3 and S4 are rendered non-conductive so that a pair of bit lines BL1, $\overline{BL1}$ are coupled to sense amplifier SA through switching transistor S1, S2. If SS1 is "0" and SS2 is "1", a pair of bit lines BL2, $\overline{BL2}$ are coupled to sense amplifier SA through switching transistor S3 and S4. Therefore, by use of address signal, one group of switching transistors S1, S2 and S3, S4 can be rendered conductive, and one of two pairs of bit lines BL1, $\overline{BL1}$, BL2, $\overline{BL2}$ can be operated. If word line selection is row selection, SS1, SS2 lines are a part of row selection lines.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A dynamic random access memory for writing information into memory devices connected to bit lines and for reading out information therefrom, comprising: bit lines and word lines; plural memory arrays disposed in an open bit memory array composition having memory devices disposed at all intersections of said bit lines and word lines; a sense amplifier row composed of a plurality of sense amplifiers disposed among said plural memory arrays, said plurality of sense amplifiers composing the sense amplifier row being arranged at a pitch which is double that of the pitch of said bit lines; wherein one of two pairs of it line pairs of said sense amplifier row which are arranged so as to be opposite to each other across a sense amplifier is connected to the sense amplifier, while bit lines isolated from the same sense amplifier are connected to two sense amplifiers which are adjacent to the same sense amplifier.

2. A dynamic random access memory for writing information into memory devices connected to bit lines and for reading out information therefrom, comprising: bit lines and word lines; plural memory arrays disposed in an open bit memory array composition having memory devices disposed at all intersections of said bit lines and word lines; a sense amplifier row composed of a plurality of sense amplifiers disposed among said plural memory arrays, said plurality of sense amplifiers composing the sense amplifier row being arranged at a pitch which is double that of the pitch of said bit lines; wherein two bit lines at diagonally opposite positions across a sense amplifier out of four bit lines disposed within one sense amplifier pitch are connected to the sense amplifier, while bit lines isolated from the same sense amplifier are connected to two sense amplifiers which are adjacent to the same sense amplifier.

* * * * *